United States Patent [19]
Holder

[11] Patent Number: 5,588,993
[45] Date of Patent: Dec. 31, 1996

[54] METHOD FOR PREPARING MOLTEN SILICON MELT FROM POLYCRYSTALLINE SILICON CHARGE

[75] Inventor: John D. Holder, Lake St. Louis, Mo.

[73] Assignee: MEMC Electronic Materials, Inc.

[21] Appl. No.: 507,055

[22] Filed: Jul. 25, 1995

[51] Int. Cl.$^6$ .................................................. C30B 15/02
[52] U.S. Cl. .................... 117/13; 117/18; 117/33; 264/345
[58] Field of Search ................... 65/144, 324; 117/1, 117/2, 4, 13, 18, 33, 81, 19, 21, 932; 264/345

[56] References Cited

U.S. PATENT DOCUMENTS

| | | | |
|---|---|---|---|
| 5,037,503 | 8/1992 | Kajimoto et al. | 117/20 |
| 5,196,173 | 3/1993 | Arai et al. | 422/249 |
| 5,223,077 | 6/1993 | Kaneko et al. | 156/620.4 |
| 5,242,531 | 9/1993 | Klingshirn et al. | 156/620.4 |
| 5,242,667 | 9/1993 | Koziol et al. | 422/249 |
| 5,340,434 | 8/1994 | Takano et al. | 117/21 |

FOREIGN PATENT DOCUMENTS

| | | |
|---|---|---|
| 50-11788 | 2/1975 | Japan . |
| 1132585 | 6/1986 | Japan . |
| 3199189 | 8/1991 | Japan . |
| 5139885 | 6/1993 | Japan . |
| 7066256 | 3/1995 | Japan . |

*Primary Examiner*—R. Bruce Breneman
*Assistant Examiner*—Felisa Garrett
*Attorney, Agent, or Firm*—Senniger, Powers, Leavitt & Roedel

[57] ABSTRACT

A process for preparing a molten silicon melt from polycrystalline silicon for use in producing single crystal silicon by the Czochralski method is disclosed. Polycrystalline silicon is initially loaded into a Czochralski crucible, and melted to form a partially melted charge which includes both molten silicon and unmelted polycrystalline silicon. The molten silicon has an upper surface above which the unmelted polycrystalline silicon is partially exposed. Granular-polycrystalline silicon is fed onto the exposed unmelted polycrystalline silicon in a manner sufficient to allow the granular-polycrystalline silicon to dehydrogenate while it is resident on the surface of the unmelted polycrystalline silicon and before it becomes immersed in the molten silicon. The granular-polycrystalline silicon and the unmelted polycrystalline silicon are then fully melted to form a molten silicon melt. The method results in improved zero defect yield, throughput and mean hot cycle times during the production of single crystal silicon ingots.

40 Claims, 1 Drawing Sheet

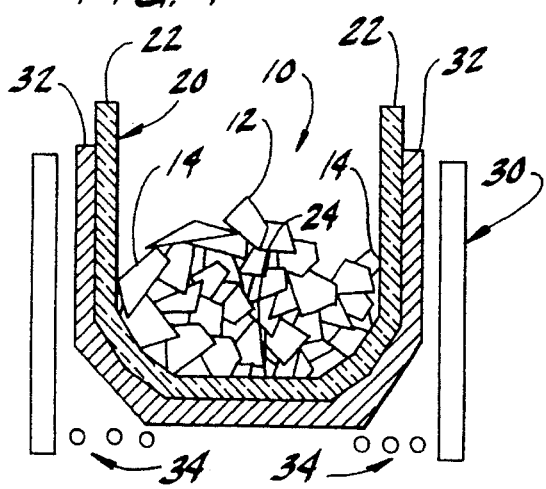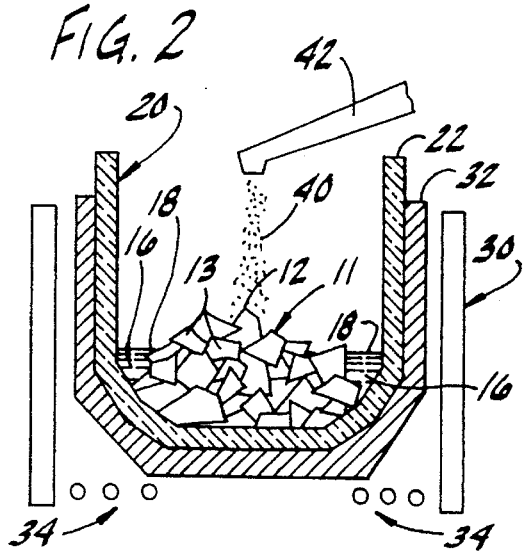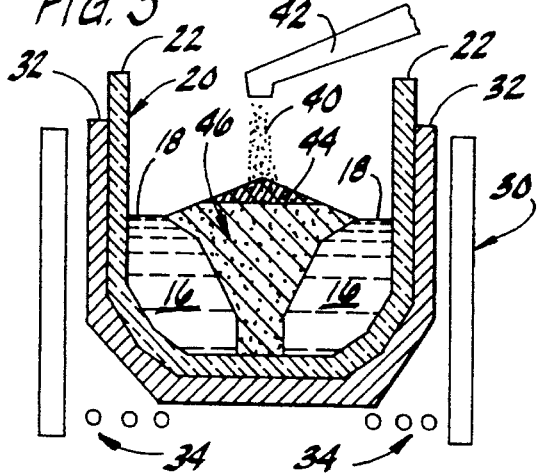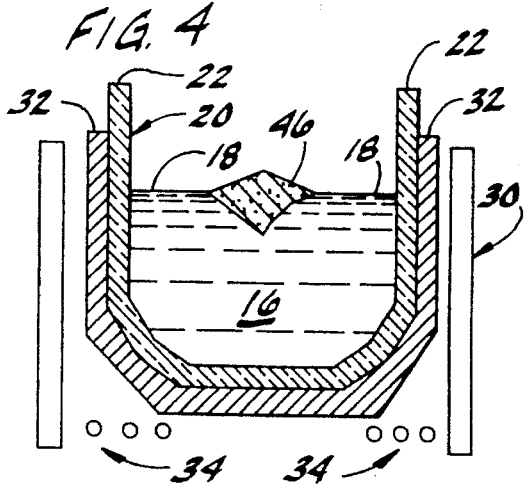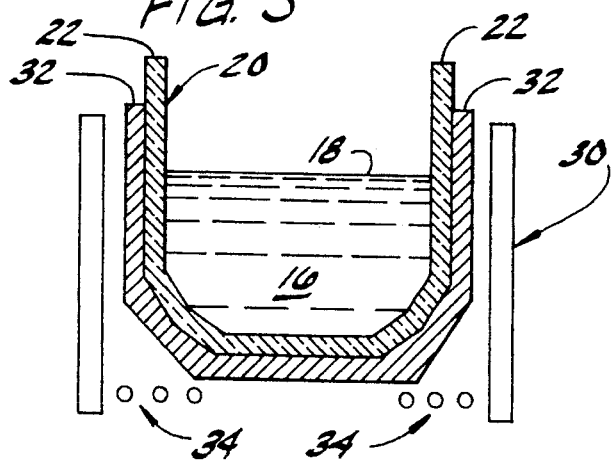

METHOD FOR PREPARING MOLTEN SILICON MELT FROM POLYCRYSTALLINE SILICON CHARGE

BACKGROUND OF THE INVENTION

The present invention generally relates to the production of single crystal silicon, and specifically, to a process for preparing a molten silicon melt from polycrystalline silicon. The invention particularly relates, in a preferred embodiment, to a process for preparing a molten silicon melt from a mixed charge of chunk and granular polycrystalline silicon.

Most single crystal silicon used for microelectronic circuit fabrication is prepared by the Czochralski (CZ) process. In this process, a single crystal silicon ingot is produced by melting polycrystalline silicon in a crucible, dipping a seed crystal into the molten silicon, withdrawing the seed crystal in a manner sufficient to achieve the diameter desired for the ingot and growing the single crystal at that diameter. The polycrystalline silicon melted to form the molten silicon is typically irregularly shaped chunk polycrystalline silicon prepared by the Siemens process or, alternatively, free-flowing, generally spherically-shaped granular polycrystalline silicon, typically prepared by a fluidized-bed reaction process. The preparation and characteristics of chunk and granular polycrystalline silicon are detailed in F. Shimura, *Semiconductor Silicon Crystal Technology*, pages 116–121, Academic Press (San Diego Calif., 1989) and the references cited therein.

The initial charging of chunk type polycrystalline silicon into the crucible and the melting thereof can introduce undesirable impurities and defects into the single crystal silicon ingot. For example, when a crucible is initially charged entirely with chunk polycrystalline silicon, the edges of the chunks under the load of a full charge can scratch and gouge the crucible wall, resulting in a damaged crucible and in particles of crucible floating on or being suspended in the silicon melt. These impurities significantly increase the likelihood of dislocations forming within the single crystal, and decrease the dislocation-free single crystal production yields and throughput. Careful arrangement of the chunk-polycrystalline silicon during the initial loading can minimize the thermal stresses. As melting proceeds, however, the charge can shift or the lower portion of the chunk-polycrystalline silicon can melt away and leave either a "hanger" of unmelted material stuck to the crucible wall above the melt or a "bridge" of unmelted material bridging between opposing sides of the crucible wall over the melt. When the charge shifts or a hanger or bridge collapses, it may splatter molten silicon and/or cause mechanical stress damage to the crucible. Additionally, initial loadings of 100% chunk-polycrystalline silicon limits the volume of material which can be charged due to the poor packing densities of such chunk materials. The volume limitations directly impact single crystal throughput.

Problems similarly exist when a CZ crucible is initially charged entirely with granular polycrystalline silicon. Large amounts of power are required to melt the granular polycrystalline due to its low thermal conductivity. The thermal stress induced in the crucible by exposure to such high meltdown-power can cause distortion of the crucible and particles of the crucible to be loosened and suspended in the melt. Like the mechanical stresses, these thermal stresses result in reduced zero-defect crystal production yields and throughput. Other problems associated with initial charges comprising 100% granular polycrystalline silicon are disclosed below with respect to the present invention. Finally, although initial loadings of granular polycrystalline silicon may be volumetrically larger than that of 100% chunk polycrystalline silicon, they typically do not result in higher overall throughput, because the degree of thermal stress on the crucible increases with the size of initial loading.

Whether the crucible is initially loaded with chunk or granular polycrystalline silicon, in many processes it is desired to add polycrystalline silicon to the melt with a feeding/metering system to increase the quantity of molten silicon. The use of such additional loadings of charge-up polycrystalline silicon is known for batch, semi-continuous or continuous process systems. In the batch system, for example, additional silicon may be loaded into the existing melt to achieve full crucible capacity in light of the decrease in volume after the initial polycrystalline silicon charge is melted. Japanese Utility Model Application No. 50-11788 (1975) is exemplary. In semi-continuous and continuous CZ systems, additional polycrystalline silicon is charged to the silicon melt to replenish the silicon withdrawn as the single crystal. F. Shimura, *Semiconductor Silicon Crystal Technology*, p. 175–83, Academic Press (San Diego Calif., 1989).

Although granular polycrystalline silicon is generally the material of choice to replenish batch, semi-continuous and continuous CZ systems because of its free-flowing form, it is not without its disadvantages. As disclosed by Kajimoto et al. in U.S. Pat. No. 5,037,503, granular polycrystalline silicon prepared by the silane process contains hydrogen in an amount sufficient to cause the silicon granules to burst or explode when they are immersed in molten silicon. The explosion or bursting of the polycrystalline silicon granules causes scattered silicon droplets to accumulate on the surface of the crucible and other components in the crystal puller which can fall into the molten silicon and interrupt crystal growth. As a solution to this problem, Kajimoto et al. suggest reducing the hydrogen content of the granular polycrystalline silicon by preheating the granular polycrystalline in an inert gas atmosphere in a separate heating apparatus until the concentration of $H_2$ is 7.5 ppm by wt. (210 ppma) or less. While this approach tends to reduce the force with which the granules explode, it does not eliminate the phenomena. Rather, the bursting phenomena can still be experienced with granular polycrystalline having a hydrogen concentration of less than 1 ppm by wt. (28 ppma). To date, granular polycrystalline silicon is available in commercial quantities having a hydrogen concentration ranging from about 0.4 to about 0.7 ppm by wt. (11–20 ppma).

SUMMARY OF THE INVENTION

It is therefore an object of the present invention to prepare a molten silicon melt suitable for producing single crystal silicon ingots with improved zero dislocation growth and throughput, by decreasing the mechanical and thermal stresses on the crucible, minimizing the concentration of hydrogen in the melt, maximizing the volume of polycrystalline silicon in the initial loading, providing ease of handling of charge-up materials, and avoiding hydrogen bursting effects during addition of charge-up polycrystalline silicon. It is also an object of the invention to prepare a molten silicon melt suitable for producing single crystal silicon ingots with improved zero dislocation growth and throughput without adding significant additional process costs, equipment or time.

Briefly, therefore, the present invention is directed to a process for preparing a molten silicon melt from polycrystalline silicon for use in producing single crystal silicon by the Czochralski method. The process comprises loading polycrystalline silicon into a crucible and melting the polycrystalline silicon until a partially melted charge is formed. The partially melted charge comprises molten silicon having an upper surface and unmelted polycrystalline silicon which is exposed above the upper surface of the molten silicon. The process further comprises feeding polycrystalline silicon onto the exposed unmelted polycrystalline silicon in a manner sufficient to allow the polycrystalline silicon to dehydrogenate before becoming immersed in the molten silicon, and then melting the unmelted polycrystalline silicon and the polycrystalline silicon fed onto the exposed, unmelted polycrystalline silicon until a molten silicon melt is formed.

Other features and objects of the present invention will be in part apparent to those skilled in the art and in part pointed out hereinafter.

BRIEF DESCRIPTION OF THE DRAWINGS

FIG. 1 is a section view of a Czochralski crucible showing an initial loading of chunk-polycrystalline silicon.

FIG. 2 is a section view showing the commencement of feeding granular-polycrystalline silicon.

FIG. 3 is a section view showing continued feeding of granular-polycrystalline silicon and the formation of a solidified silicon mass.

FIG. 4 is a section view showing the completion of feeding granular-polycrystalline silicon.

FIG. 5 is a section view showing a molten silicon mass.

DETAILED DESCRIPTION OF THE INVENTION

In the present invention, polycrystalline silicon is initially loaded into a Czochralski (CZ) crucible, and melted to form a partially melted charge which includes both molten silicon and unmelted polycrystalline silicon. The molten silicon has an upper surface above which the unmelted polycrystalline silicon is at least partially exposed. Granular-polycrystalline silicon is fed onto the exposed unmelted polycrystalline silicon in a manner sufficient to allow the granular-polycrystalline silicon to dehydrogenate while it is resident on the surface of the unmelted polycrystalline silicon and before it becomes immersed in the molten silicon. The granular-polycrystalline silicon and the unmelted polycrystalline silicon of the initial loading are then fully melted to form a molten silicon melt. The invention is described in further detail below with reference to the figures, in which like items are numbered the same in the several figures.

With reference now to FIG. 1, polycrystalline silicon 10 is loaded into a standard CZ crucible 20. Although either granular-polycrystalline silicon or chunk-polycrystalline silicon could be used for the initial loading, chunk-polycrystalline silicon is generally preferred. The use of granular-polycrystalline silicon for the initial loading can result in relatively poor production yields and a high incidence of large void defects forming in the single crystal silicon ingot. It is believed that the granular-polycrystalline silicon traps gasses such as argon or hydrogen at the bottom 24 of the crucible 20, and that these gasses later release as bubbles into the silicon melt during crystal growth. Some of the bubbles become attached to the crystal at the crystal growth interface, thus forming void defects. The use of chunk-polycrystalline silicon for the initial loading avoids the formation of these void defects, and generally results in higher yields.

The amount of polycrystalline silicon initially loaded into the crucible is preferably optimized with respect to the quality of the single crystal silicon ingot and production throughput. If too much chunk-polycrystalline silicon is loaded into the crucible, higher mechanical stresses occur, and there is also an increased probability of the charge shifting or forming bridges or hangers. Economic, availability or other factors favoring granular-polycrystalline silicon may also encourage minimizing the amount of chunk-polycrystalline silicon in the initial load. If too little chunk-polycrystalline silicon is loaded, however, a considerably greater amount of power is required to melt the charge. The higher wall temperatures associated with the use of such higher power can result in premature crucible degradation. In addition to these factors, the initial loading size will also vary with crucible design, hot zone design and the types of crystal products being produced. For example, in a 100 kg total charge using a 22 inch crucible, an initial loading of chunk-polycrystalline silicon of 40–65 kg is preferred with a loading of 50–60 kg being more preferred.

In the preferred embodiment, the initial charge of chunk-polycrystalline silicon is arranged in the crucible with the center 12 of the polycrystalline silicon 10 being about 23.5 to 31 mm higher than the edge 14. The crucible 20 is set at a position such that its top edge 22 is about 10–80 mm above the top edge 32 of the side heater 30, and preferably at about 50 mm. This crucible position is maintained constant for the duration of the meltdown.

The polycrystalline silicon 10 is melted until a partially melted charge forms in the crucible 20. As shown in FIG. 2, the partially melted charge comprises both molten silicon 16 and unmelted polycrystalline silicon 11. The molten silicon 16 has an upper surface 18 above which the unmelted polycrystalline silicon 11 is exposed. The unmelted polycrystalline silicon 11 is essentially an island surrounded by the molten silicon 16.

The partially melted charge is formed by heating the crucible 20 with both side heater 30 and bottom heater 34. To melt an initial loading of 55 kg of chunk-polycrystalline silicon in a 22 inch crucible, for example, the side and bottom heaters 30, 34 are maintained at power levels of 161 kW and 30 kW, respectively.

The extent to which the initial load of polycrystalline silicon is melted to form the polycrystalline silicon island may be specifically defined in terms of the amount of surface area of the upper surface 18 of the molten silicon 16 relative to the total surface area in the partially melted charge, where the total surface area refers to the surface area of both the upper surface 18 of the molten silicon 16 and the surface 13 of the unmelted polycrystalline silicon 11. By this measure, the initial load of polycrystalline silicon 10 is preferably melted until the upper surface 18 of the molten silicon 16 comprises from about 25–50% of the total surface area, and most preferably around 30%. Alternatively, the extent of melting may be defined with respect to the relative amounts of molten silicon 16 and unmelted polycrystalline silicon 11. In the preferred embodiment, the initial load of polycrystalline silicon 10 is melted until the ratio of molten silicon 16 to unmelted chunk-polycrystalline silicon 11 in the partially melted charge is between about 3:2 and 4:1 by weight. In the preferred embodiment using the heater power values recited above, about five hours is required to form the partially melted charge.

After forming the partially melted charge in the crucible 20, polycrystalline silicon 40 is fed onto the exposed unmelted polycrystalline silicon 11, as shown in FIG. 2. The polycrystalline silicon should be fed onto the island of unmelted polycrystalline silicon 11 rather than into the molten silicon 16.

The weight ratio of polycrystalline silicon initially loaded to polycrystalline silicon fed onto the island is preferably between about 2:3 and about 2:1, and more preferably between about 1:1 and 3:2. For a 100 kg total charge to a 22 inch crucible, for example, a 55 kg loading of chunk-polycrystalline silicon is most preferred based on the factors detailed above with the balance of the total charge being fed to the exposed portion of the island.

The manner of feeding polycrystalline is preferably controlled to allow the polycrystalline silicon 40 to dehydrogenate while it is resident on the surface 13 of the unmelted polycrystalline silicon 11 and before it becomes immersed in the molten silicon 16. Dehydrogenation refers to the diffusion of entrapped hydrogen molecules ($H_2$) or atoms (H) through the crystal structure of the polycrystalline silicon. Accordingly, the factors affecting dehydrogenation include the temperature-dependent diffusion constant of hydrogen, the distance through which the hydrogen must diffuse to escape the crystal structure, and time. Generally, for polycrystalline silicon chunks or granules of a particular size, as temperature increases, the diffusion constant increases, and the time required for the hydrogen to diffuse decreases. Conversely, as the time available for the hydrogen to diffuse decreases, higher temperatures are required to effect diffusion.

Because the feed rate of polycrystalline silicon 40 affects the length of time that the polylcrystalline silicon is heated before becoming immersed in the molten silicon 16, it is preferred that the polycrystalline silicon 40 be fed onto the exposed unmelted polycrystalline silicon 11 at a rate sufficient to allow the residence time and the residence temperature of the polycrystalline silicon 40 to be, in combination, sufficient to allow hydrogen to diffuse from the polycrystalline silicon 40 before the polycrystalline silicon 40 becomes immersed in the molten silicon 16. For purposes of the present invention, the residence time is defined as the period of time during which the polycrystalline silicon 40 is resident on (i.e., in physical contact with) the exposed, unmelted polycrystalline silicon 11 before becoming immersed in the molten silicon 16. Similarly, the residence temperature is defined as the time-averaged temperature achieved and maintained while the polycrystalline silicon is resident on the exposed, unmelted polycrystalline silicon 11. Although some of the polycrystalline silicon fed onto the exposed unmelted polycrystalline silicon 11 may have a relatively short residence time, the feeding can be controlled such that most of it will have a residence time which is adequate to effect dehydrogenation.

The polycrystalline silicon fed onto the exposed, unmelted polycrystalline silicon is preferably granular polycrystalline silicon. Granular polycrystalline silicon is generally easier to feed and results in a more uniform residence time as compared to chunk polycrystalline silicon. Preferably, the granular-polycrystalline silicon is dust free and 90% of the granules (by weight) have a size distribution falling within the range of about 400μm to about 1400μm.

In the preferred embodiment, the granular-polycrystalline silicon 40 is fed onto the exposed unmelted polycrystalline silicon 11 at a rate sufficient to allow the temperature of the granular-polycrystalline silicon 40 to rise to about 1200° C. for a period of about 30 seconds before the granular-polycrystalline silicon 40 becomes immersed in the molten silicon 16. Although a 30 second resident time is preferred, resident times as short as 10 seconds appear to be sufficient to ensure proper dehydrogenation. More specifically, for the particular crucible design, and for the size and arrangement of the initial loading of chunk-polycrystalline silicon used in the preferred process, the granular-polycrystalline silicon is fed onto the exposed unmelted polycrystalline silicon at a rate ranging from about 5 kg/hr to about 15 kg/hr, and most preferably at a rate of about 10 kg/hr. Such low feed rates also minimize the thermal stresses on the crucible and thereby minimize crucible degradation.

The type and hydrogen concentration of the granular-polycrystalline silicon used in the preferred embodiment of the present invention is not critical as long as the feed rate and other process parameters are controlled to ensure adequate dehydrogenation. The present invention is advantageous over prior art methods with respect to the ability to use granular-polycrystalline silicon having a wide range of hydrogen concentrations, including concentrations up to about 500 ppma. Preferably, the hydrogen concentration of the granular-polycrystalline silicon 40 fed onto the exposed unmelted polycrystalline silicon 11 is less than about 400 ppma, more preferably less than 50 ppma, and most preferably less than about 20 ppma.

Referring now to FIGS. 2 and 3, the granular-polycrystalline silicon 40 is, in one embodiment, fed onto the exposed unmelted polycrystalline silicon 11 through a quartz glass feed tube 42. Prior to and during charging of granular-polycrystalline silicon, the feed tube 42 is movably positioned over the center of the crucible 20 and directly above the center 12 of the exposed unmelted polycrystalline silicon 11. Feeding commences when the partially melted charge is formed, as defined earlier. The granular-polycrystalline silicon 40 forms an island 44 over the surface 13 of the exposed unmelted polycrystalline silicon 11, with the slope of the island 44 equal to the angle of repose for the granular-polycrystalline silicon 40. For the granular-polycrystalline silicon available from Albemarle, the angle of repose is approximately 31 degrees. While the granules of granular-polycrystalline silicon 40 are resident on the island 44, the temperature of the granules rises quickly to result in rapid dehydrogenation before the granules become immersed in the molten silicon 16. Dehydrogenation of the granular polycrystalline silicon may be effected under the same type of atmospheric conditions, typically under an inert gas, as are known in the art for preparing silicon melts in CZ crucibles. After dehydrogenation, the hydrogen concentration of the granules is less than the saturation concentration of hydrogen in silicon at the melting point of silicon. That is, the concentration of hydrogen after dehydrogenation is less than 1 ppma (0.036 ppm by wt.).

Both the side and bottom heaters 30, 34 remain energized during the feeding of granular-polycrystalline silicon 40 onto the exposed unmelted polycrystalline silicon 11. In the preferred embodiment, the power level of the side heater 30 is reduced from 161 kW to 160 kW approximately one hour after feeding is commenced, and then further reduced to 155 kW approximately two hours after feeding is commenced. The power level of the bottom heater 34 remains constant at 30 kW. As shown in FIG. 3, the combined effect of the continued heating during feeding of granular-polycrystalline silicon is to result in a solidified silicon mass 46 forming underneath the island 44. In the preferred embodiment, the solidified silicon mass 46 comprises both chunk-polycrystalline silicon from the initial loading and granular-polycrystalline silicon from the latter feeding.

Feeding continues at the optimal feed rate until the total amount of silicon mass desired in the final silicon melt has been charged into the crucible 20. For a 100 kg total melt mass in which 55 kg of chunk-polycrystalline silicon was used for the initial loading, 45 kg of granular-polycrystalline silicon 40 must be charged through the feed tube 42. However, larger total charges may also be realized where the crucible 20 can accommodate the additional silicon melt. For a 120 kg total melt mass, 65 kg of granular-polycrystalline silicon is charged in the same manner as described above. In the preferred embodiment at the optimal feed rate, about 4.5 and 6.5 hours are required to feed up for a 100 kg and 120 kg total melt mass, respectively. After the feeding of granular-polycrystalline silicon 40 is complete, the feed tube 42 can be positioned away from the center of the crucible 20 to allow for crystal pulling. At this point, as shown in FIG. 4, the bulk of the silicon in the crucible 20 is molten silicon 16, with a relatively smaller amount of solidified silicon mass 46 remaining.

The granular-polycrystalline silicon and the unmelted polycrystalline silicon, collectively comprising the solidified silicon mass 46, are further melted to form a molten silicon melt. As shown in FIG. 5, the molten silicon melt comprises 100% molten silicon 16. In the preferred embodiment, the power level for the side and bottom heaters, 30 and 34, are maintained at 155 kW and 30 kW, respectively, to effectuate the final melting in approximately ½ hour. Accordingly, the total time required to form a 100 kg molten silicon met is approximately 10 hours. For a 120 kg molten silicon melt, approximately 12 hours is required.

The following examples illustrate the principles and advantages of the invention.

EXAMPLES

Molten silicon melts, prepared by both conventional methods and the methods of the present invention, were used to produce single crystal silicon ingots by the Czochralski method. Data was collected to evaluate the relative performance of the molten silicon melts prepared by the various methods.

In each of the examples presented below, molten silicon melts were prepared using three different types of charges and methods. First, molten silicon melts were prepared from polycrystalline silicon charges comprising 100% chunk-polycrystalline silicon by conventional methods known in the art. Additionally, molten silicon melts were prepared from polycrystalline silicon charges comprising 100% granular-polycrystalline silicon according to the less preferred embodiment of the present invention (i.e., an initial loading of approximately 50 kg granular-polycrystalline silicon with the balance being granular-polycrystalline silicon fed in a subsequent step). Finally, molten silicon melts were prepared from mixed polycrystalline silicon charges comprising approximately 55 kg chunk-polycrystalline silicon and the balance granular-polycrystalline silicon according to the preferred methods of the present invention. These three different types of charges and their associated molten silicon melts are hereinafter referred to as "pure chunk," "pure granular" and "mixed" charges or melts, respectively.

The concentration of hydrogen in the granular-polycrystalline silicon typically varied from about 11 ppma to about 28 ppma with no detectable impact on the results. Furthermore, in one of the mixed charge test runs, a full-length crystal was produced using granular-polycrystalline silicon with a hydrogen concentration of about 400 ppma. This crystal had no detectable differences with respect to essential characteristics as compared to the crystals produced using granular-polycrystalline silicon with lower hydrogen concentrations. Although the granular-polysilicon with a higher hydrogen content resulted in an increased density of very small silicon droplets above the final melt position on the crucible wall, zero defect crystal growth was not affected.

In each of the examples, data was collected to support calculation of the following performance parameters: zero defect (ZD) yield, throughput, and mean hot cycle times. In the art, zero defect yield measures production efficiency in terms of the number of inches of dislocation-free single crystal silicon ingot produced per kilogram of polycrystalline silicon starting material consumed (in/kg). Throughput measures temporal efficiency as the ratio of the number of inches of dislocation-free single crystal silicon ingot produced relative to the total cycle time (in/hr). Finally, the mean hot cycle time is the average total time that the crystal puller heaters are energized per cycle (hr). Accordingly, high ZD yield values, high throughput values, and low mean hot cycle time values are preferable.

Example 1

In a first set of experimental tests, sixty-nine 100 kg molten silicon melts were prepared: forty-seven from pure chunk charges; twelve from pure granular charges; and ten from mixed charges. Each of these molten silicon melts were used to produce corresponding single crystal silicon ingots. Data was collected to determine the zero defect (ZD) yield, throughput, and mean hot cycle time parameters for each of the silicon melts prepared.

Table I shows normalized average values for each of these parameters for the molten silicon melts prepared from pure chunk, pure granular and mixed charges. The values presented in Table I are normalized to the average value obtained from runs conducted for the pure chunk charges.

TABLE I

| | 100 kg MOLTEN SILICON MELTS* | | |
|---|---|---|---|
| | CHARGE TYPE | | |
| PARAMETER | Pure Chunk | Pure Granular | Mixed |
| ZD Yield (in/kg/in/kg) | 1.0 | 0.971 | 1.203 |
| Throughput (in/hr/in/hr) | 1.0 | 0.783 | 1.290 |
| Mean Hot Cycle Time (hr/hr) | 1.0 | 1.351 | 0.923 |

*Values normalized to the average values obtained using pure chunk loadings for 100 kg melts.

Example 1 clearly demonstrates the relative merits of the present invention. As shown in Table I, the production of single crystal silicon ingots from a molten silicon melt prepared using a mixed charge according to the preferred methods of the present invention offers a 20% increase in zero defect yield and almost 30% increase in throughput over melts prepared by conventional methods from pure chunk charges. Likewise, an almost 8% reduction in mean hot cycle time was realized as compared to conventional methods from pure chunk charges. The example also demonstrates that the use of pure granular charges to form a silicon melt according to the present invention are a less preferred embodiment.

Examples 2

In a second set of experimental tests, thirty-five molten silicon melts were prepared: twenty-six from 100 kg pure chunk charges; four from 120 kg pure granular charges; and five from mixed charges totalling 120 kg. Each of these molten silicon melts were used to produce corresponding single crystal silicon ingots. Data was collected to determine the zero defect (ZD) yield, throughput and mean hot cycle time parameters for each of the silicon melts prepared.

Table II shows normalized average values for each of these parameters for the molten silicon melts prepared from pure chunk, pure granular and mixed charges. Values presented in Table II are normalized to the average value obtained from runs conducted for the pure chunk charges.

TABLE II 120 kg MOLTEN SILICON MELTS*

| PARAMETER | CHARGE TYPE | | |
|---|---|---|---|
| | Pure Chunk (100 kg) | Pure Granular (120 kg) | Mixed (120 kg) |
| ZD Yield (in/kg/in/kg) | 1.0 | 0.736 | 1.250 |
| Throughput (in/hr/in/hr) | 1.0 | 0.612 | 1.142 |
| Mean Hot Cycle Time (hr/hr) | 1.0 | 1.538 | 1.167 |

*Values normalized to the average values obtained using pure chunk loadings for 100 kg melts.

Example 2 also demonstrates substantial advantages over conventional methods in terms of zero defect yield (25% increase) and throughput (14% increase). Further, these improvements in zero defect yield and throughput are realized with the resulting melt being 20% larger than is possible with a pure chunk loading.

In light of the detailed description of the invention and the examples presented above, it can be appreciated that the several objects of the invention are achieved.

The explanations and illustrations presented herein are intended to acquaint others skilled in the art with the invention, its principles, and its practical application. Those skilled in the art may adapt and apply the invention in its numerous forms, as may be best suited to the requirements of a particular use. Accordingly, the specific embodiments of the present invention as set forth are not intended as being exhaustive or limiting of the invention.

We claim:

1. A process for preparing a pool of molten silicon in a crucible for use in growing a single crystal silicon ingot by the Czochralski method, the process comprising:
   (a) forming a partially melted charge in a crucible, the partially melted charge comprising molten silicon having an upper surface and unmelted polycrystalline silicon exposed above the upper surface of the molten silicon;
   (b) feeding polycrystalline silicon onto the exposed unmelted polycrystalline silicon; and
   (c) melting the unmelted polycrystalline silicon and the polycrystalline silicon fed onto the exposed unmelted polycrystalline silicon to form a pool of molten silicon.

2. The process as set forth in claim 1 wherein the partially melted charge is formed by loading chunk polycrystalline silicon into the crucible and melting a portion of the chunk polycrystalline silicon.

3. The process as set forth in claim 2 wherein the polycrystalline silicon fed onto the exposed unmelted polycrystalline silicon contains less than about 50 ppma hydrogen.

4. The process as set forth in claim 2 wherein the upper surface of the molten silicon has a surface area which comprises between about 25% and 50% of the total surface area of the partially melted charge.

5. The process as set forth in claim 2 wherein a weight ratio of the molten silicon to the unmelted chunk-polycrystalline silicon in the partially melted charge ranges from about 3:2 to about 4:1.

6. The process as set forth in claim 1 wherein polycrystalline silicon fed onto the exposed unmelted polycrystalline silicon is granular polycrystalline silicon and the step of forming the partially melted charge comprises loading chunk polycrystalline silicon into the crucible and melting a portion of the chunk polycrystalline silicon.

7. The process as set forth in claim 6 wherein a weight ratio of the chunk polycrystalline silicon loaded into the crucible to the granular polycrystalline silicon fed onto the exposed unmelted polycrystalline silicon ranges from about 2:3 to about 2:1.

8. The process as set forth in claim 6 wherein a weight ratio of the chunk polycrystalline silicon loaded into the crucible to the granular polycrystalline silicon fed onto the exposed unmelted polycrystalline silicon ranges from about 1:1 to about 3:2.

9. The process as set forth in claim 1 wherein the polycrystalline silicon fed onto the exposed unmelted polycrystalline silicon is granular polycrystalline silicon containing less than about 500 ppma hydrogen when fed onto the exposed unmelted polycrystalline silicon.

10. The process as set forth in claim 6 wherein the granular polycrystalline silicon contains less than about 50 ppma hydrogen when fed onto the exposed unmelted chunk polycrystalline silicon.

11. The process as set forth in claim 6 wherein the granular polycrystalline silicon contains less than about 20 ppma hydrogen when fed onto the exposed unmelted chunk polycrystalline silicon.

12. The process as set forth in claim 6 wherein the granular-polycrystalline silicon resides on the exposed unmelted polycrystalline silicon after it is fed onto the exposed unmelted polycrystalline silicon and a portion of the granular-polycrystalline silicon subsequently becomes immersed in the molten silicon.

13. The process as set forth in claim 12 wherein the granular-polycrystalline silicon is fed onto the exposed unmelted chunk-polycrystalline silicon at a rate which is controlled such that the temperature of the granular-polycrystalline silicon rises to about 1200° C. for a period of about 30 seconds while the granular-polycrystalline silicon resides on the exposed unmelted polycrystalline silicon.

14. The process as set forth in claim 6 wherein the granular-polycrystalline silicon is fed onto the exposed unmelted chunk-polycrystalline silicon at a rate ranging from about 5 kg/hr to about 15 kg/hr.

15. The process as set forth in claim 6 wherein the granular-polycrystalline silicon is fed onto the exposed unmelted chunk-polycrystalline silicon at a rate of about 10 kg/hr.

16. A process for preparing a molten silicon melt from polycrystalline silicon for use in producing a single crystal silicon ingot by the Czochralski method, the process comprising:
   (a) forming a partially melted charge in a crucible, the partially melted charge comprising molten silicon having an upper surface and unmelted polycrystalline silicon exposed above the upper surface of the molten silicon;

(b) feeding granular polycrystalline silicon onto the exposed unmelted polycrystalline silicon at a feed rate controlled such that the granular polycrystalline silicon resides on the exposed unmelted polycrystalline silicon and such that hydrogen diffuses from the granular-polycrystalline silicon while the granular polycrystalline silicon resides on the exposed unmelted polycrystalline silicon; and (c) melting the unmelted polycrystalline silicon and the polycrystalline silicon fed onto the exposed unmelted polycrystalline silicon to form a molten silicon melt.

17. The process of claim 16 wherein the feed rate of the granular-polycrystalline silicon is controlled such that the temperature of the granular-polycrystalline silicon rise to about 1200° C. for a period of about 30 seconds while the granular-polycrystalline silicon resides on the exposed unmelted polycrystalline silicon.

18. The process as set forth in claim 16 wherein the partially melted charge is formed by loading chunk polycrystalline silicon into the crucible and melting a portion of the chunk polycrystalline silicon.

19. The process as set forth in claim 16 wherein the feed rate of the granular polycrystalline silicon is controlled such that the hydrogen concentration of the granular-polycrystalline silicon is reduced to less than 1 ppma while it resides on the exposed unmelted polycrystalline silicon.

20. A process for preparing a molten silicon melt from polycrystalline silicon for use in producing a single crystal silicon ingot by the Czochralski method, the process comprising:

(a) loading chunk-polycrystalline silicon into a crucible, the amount of chunk-polycrystalline silicon load being between about 40% to about 65% of the total amount of polycrystalline silicon melted to form the silicon melt;

(b) melting the chunk-polycrystalline silicon until a partially melted charge forms in the crucible, the partially melted charge comprising molten silicon having an upper surface and unmelted chunk-polycrystalline silicon exposed above the upper surface of the molten silicon;

(c) feeding granular-polycrystalline silicon onto the exposed unmelted chunk-polycrystalline silicon, the granular-polycrystalline silicon containing less than about 400 ppma hydrogen, the feeding being at a rate controlled such that the granular polycrystalline silicon resides on the exposed unmelted polycrystalline silicon and such that the temperature of the granular-polycrystalline silicon rises to about 1200° C. for a period of at least about 10 seconds while it resides on the exposed unmelted polycrystalline silicon; and (d) melting the unmelted chunk-polycrystalline silicon and the granular-polycrystalline silicon until a molten silicon melt is formed.

21. A process for preparing a pool of molten silicon in a crucible for use in growing a single crystal silicon ingot by the Czochralski method, the process comprising:

(a) forming a partially melted charge in a crucible, the partially melted charge comprising molten silicon having an upper surface and unmelted polycrystalline silicon exposed above the upper surface of the molten silicon;

(b) feeding granular-polycrystalline silicon onto the exposed unmelted polycrystalline silicon;

(c) allowing the temperature of the granular-polycrystalline silicon to rise to about 1200° C. for a period of at least about 10 seconds; and (d) melting the unmelted polycrystalline silicon and the granular-polycrystalline silicon to form a pool of molten silicon.

22. The process as set forth in claim 21 wherein the partially melted charge is formed by loading chunk polycrystalline silicon into the crucible and melting a portion of the chunk polycrystalline silicon.

23. The process as set forth in claim 22 wherein a weight ratio of the chunk polycrystalline silicon loaded into the crucible to the granular polycrystalline silicon fed onto the exposed unmelted polycrystalline silicon ranges from about 2:3 to about 2:1.

24. The process as set forth in claim 22 wherein the granular polycrystalline silicon contains less than about 50 ppma hydrogen when fed onto the exposed unmelted chunk polycrystalline silicon.

25. The process as set forth in claim 22 wherein the granular polycrystalline silicon contains less than about 20 ppma hydrogen when fed onto the exposed unmelted chunk polycrystalline silicon.

26. The process as set forth in claim 21 wherein a weight ratio of the molten silicon to the unmelted polycrystalline silicon in the partially melted charge ranges from about 3:2 to 4:1.

27. The process as set forth in claim 21 wherein the granular-polycrystalline fed onto the exposed unmelted polycrystalline silicon resides thereon and has a hydrogen concentration which is reduced to less than about 1 ppma while the granular-polycrystalline silicon resides on the exposed unmelted polycrystalline silicon.

28. A process for preparing a pool of molten silicon in a crucible for use in growing a single crystal silicon ingot by the Czochralski method, the process comprising:

(a) forming a partially melted charge in a crucible, the partially melted charge comprising molten silicon having an upper surface and unmelted polycrystalline silicon exposed above the upper surface of the molten silicon;

(b) feeding granular-polycrystalline silicon onto the exposed unmelted polycrystalline silicon, (c) allowing the granular-polycrystalline silicon to reside on the exposed unmelted polycrystalline at a temperature and for a period of time sufficient for hydrogen to diffuse from the granular-polycrystalline silicon; and (d) melting the unmelted polycrystalline silicon and the granular-polycrystalline silicon fed onto the exposed unmelted polycrystalline silicon to form a pool of molten silicon.

29. The process as set forth in claim 28 wherein the partially melted charge is formed by loading chunk polycrystalline silicon into the crucible and melting a portion of the chunk polycrystalline silicon.

30. The process as set forth in claim 29 wherein the polycrystalline silicon contains less than about 50 ppma hydrogen when fed onto the exposed unmelted chunk polycrystalline silicon.

31. The process as set forth in claim 29 wherein the polycrystalline silicon contains less than about 20 ppma hydrogen when fed onto the exposed unmelted polycrystalline silicon.

32. The process as set forth in claim 29 wherein the temperature of the granular-polycrystalline silicon residing on the exposed unmelted polycrystalline silicon rises to about 1200° C. for a period of about 30 seconds while the granular-polycrystalline silicon resides on the exposed unmelted polycrystalline silicon.

33. The process as set forth in claim 29 wherein the granular-polycrystalline silicon has a hydrogen concentration which is reduced to less than 1 ppma while the granular-polycrystalline silicon resides on the exposed unmelted polycrystalline silicon.

34. A process for preparing a pool of molten silicon in a crucible for use in growing a single crystal silicon ingot by the Czochralski method, the process comprising:

(a) forming a partially melted charge in a crucible, the partially melted charge comprising molten silicon having an upper surface and unmelted polycrystalline silicon exposed above the upper surface of the molten silicon;

(b) feeding polycrystalline silicon comprising hydrogen onto the exposed unmelted polycrystalline silicon such that the polycrystalline silicon resides thereon for a period of time;

(c) allowing hydrogen to diffuse from the polycrystalline silicon during the period of time in which it resides on the exposed unmelted polycrystalline silicon; and (d) melting the unmelted polycrystalline silicon and the polycrystalline silicon which is fed in step (b) to form a pool of molten silicon.

35. The process as set forth in claim 34 wherein the partially melted charge is formed by loading chunk polycrystalline silicon into the crucible and melting a portion of the chunk polycrystalline silicon.

36. The process as set forth in claim 34 wherein the polycrystalline silicon contains less than about 50 ppma hydrogen when fed onto the exposed unmelted chunk polycrystalline silicon.

37. The process as set forth in claim 34 wherein the polycrystalline silicon contains less than about 20 ppma hydrogen when fed onto the exposed unmelted polycrystalline silicon.

38. The process as set forth in claim 34 wherein the polycrystalline silicon fed onto the exposed unmelted polycrystalline silicon rises to a temperature of about 1200° C. for a period of about 30 seconds during the period of time in which it resides on the exposed unmelted polycrystalline silicon.

39. The process as set forth in claim 34 wherein the polycrystalline silicon fed onto the exposed unmelted polycrystalline silicon has a hydrogen concentration which is reduced to less than about 1 ppma during the period of time in which it resides on the exposed unmelted polycrystalline silicon.

40. The process as set forth in claim 34 wherein the polycrystalline silicon fed onto the exposed unmelted polycrystalline silicon is granular polycrystalline silicon and the step of forming the partially melted charge comprises loading chunk polycrystalline silicon into the crucible and melting a portion of the chunk polycrystalline silicon.

* * * * *